United States Patent
Nishida et al.

(10) Patent No.: US 10,115,636 B2
(45) Date of Patent: Oct. 30, 2018

(54) PROCESSING METHOD FOR WORKPIECE

(71) Applicant: DISCO CORPORATION, Tokyo (JP)

(72) Inventors: Yoshiteru Nishida, Tokyo (JP);
Tomotaka Tabuchi, Tokyo (JP);
Hiroyuki Takahashi, Tokyo (JP);
Susumu Yokoo, Tokyo (JP); Kenji Okazaki, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/820,809

(22) Filed: Aug. 7, 2015

(65) Prior Publication Data
US 2016/0042962 A1    Feb. 11, 2016

(30) Foreign Application Priority Data

Aug. 8, 2014 (JP) .................................. 2014-162184

(51) Int. Cl.
*H01L 21/78* (2006.01)
*H01L 21/311* (2006.01)
*H01L 21/3213* (2006.01)

(52) U.S. Cl.
CPC ............ *H01L 21/78* (2013.01); *H01L 21/311* (2013.01); *H01L 21/3213* (2013.01)

(58) Field of Classification Search
None
See application file for complete search history.

(56) References Cited

U.S. PATENT DOCUMENTS

| 2007/0281094 A1* | 12/2007 | Nishio | .................... B08B 5/023 |
| | | | 427/348 |
| 2010/0032408 A1* | 2/2010 | Giovanola | ............. B41J 2/1603 |
| | | | 216/27 |
| 2012/0228615 A1* | 9/2012 | Uochi | ................... G11C 11/403 |
| | | | 257/57 |
| 2016/0064294 A1* | 3/2016 | Reber | ..................... H01L 24/02 |
| | | | 257/499 |

FOREIGN PATENT DOCUMENTS

| JP | 63114879 A | 5/1988 |
| JP | 05337830 A | 12/1993 |
| JP | 2003-197569 | 7/2003 |
| JP | 2003-320466 | 11/2003 |
| JP | 2004-172365 | 6/2004 |
| JP | 2011124277 A | 6/2011 |
| WO | 2012173770 A2 | 12/2012 |

\* cited by examiner

*Primary Examiner* — Julio J Maldonado
*Assistant Examiner* — Stanetta Isaac
(74) *Attorney, Agent, or Firm* — Greer Burns & Crain Ltd.

(57) ABSTRACT

A workpiece has a plurality of low-dielectric-constant insulation films and a metallic pattern stacked on a surface of a semiconductor substrate. Devices are formed in a plurality of regions partitioned by streets formed in a grid pattern. Surfaces of the devices formed on the workpiece are covered with a surface protective member, leaving the streets exposed. A dispersion of abrasive grains in an etching liquid capable of dissolving the metallic pattern is blasted against the workpiece together with compressed gas so as to remove the low-dielectric-constant insulation films and the metallic pattern on the streets, thereby exposing the semiconductor substrate. The workpiece is divided with the semiconductor substrate exposed by the wet blasting step subjected to dry etching so as to divide the workpiece along the streets.

3 Claims, 4 Drawing Sheets

PROCESSING METHOD FOR WORKPIECE

BACKGROUND OF THE INVENTION

Field of the Invention

The present invention relates to a processing method for a plate-shaped workpiece.

Description of the Related Art

In small-sized, lightweight electronic apparatuses represented by cell phones, device chips provided with electronic circuit (device) such as IC are indispensable for the configuration. The device chips can be manufactured, for example, by a method in which a surface (front side) of a semiconductor substrate formed of silicon or the like material is sectioned into regions by a plurality of division lines called streets, the devices are formed in the regions, and then the semiconductor substrate is divided along the streets.

In recent years, a technology has been put to practical use in which wirings of the devices are insulated from each other by a low-dielectric-constant insulation film called low-k film. With the low-k film used for insulation between the wirings, it is possible to suppress the capacitance generated between the wirings to a low level and to inhibit a delay of signals even when the spacing between the wirings is reduced due to process miniaturization. This ensures that the processing performance of the device is maintained at a high level. The aforementioned low-k film is formed by stacking a plurality of layers, and its mechanical strength is low. When the semiconductor substrate is divided through cutting by a cutting blade, for example, therefore, the low-k film would be exfoliated from the semiconductor substrate. To solve this problem, a processing method has been proposed in which the semiconductor substrate is cut after the low-k film is partly removed by irradiation with a laser beam (see, for example, Japanese Patent Laid-open No. 2003-320466). In this method, first, the laser beam is applied along the streets from the front side of the semiconductor substrate to remove part of the low-k film by ablation. Thereafter, the regions deprived of the low-k film are cut by a cutting blade, whereby the semiconductor substrate can be divided while keeping low the possibility of exfoliation of the low-k film.

Meanwhile, a test element called TEG (Test Elements Group) may sometimes be disposed on the street of the semiconductor substrate. When the aforementioned processing method is applied to the division of the semiconductor substrate, a metallic pattern contained in the TEG blocks the laser beam, so that the low-k film cannot be removed suitably. Although enhancing the output of the laser beams enables adequate removal of the low-k film, the possibility of scattering of debris is raised in that case, leading to a lowered device chip quality. To divide the semiconductor substrate, a processing method using plasma etching may be employed (see, for example, Japanese Patent Laid-open Nos. 2003-197569 and 2004-172365). In the case of plasma etching applied to processing of a semiconductor substrate formed of silicon or the like material, however, the metallic pattern contained in the TEG cannot be removed suitably.

SUMMARY OF THE INVENTION

It is therefore an object of the present invention to provide a processing method by which low-dielectric-constant films and a metallic pattern on streets can be removed suitably.

In accordance with an aspect of the present invention, there is provided a method of processing a workpiece in which a plurality of low-dielectric-constant insulation films and a metallic pattern are stacked on a surface of a semiconductor substrate and in which devices are formed in a plurality of regions partitioned by streets formed in a grid pattern, the method including: a masking step of covering surfaces of the devices formed on the workpiece with a surface protective member, leaving the streets exposed; a wet blasting step of dispersing abrasive grains in an etching liquid capable of dissolving the metallic pattern, and blasting the dispersion against the workpiece together with compressed gas so as to remove the low-dielectric-constant insulation films and the metallic pattern on the streets, thereby exposing the semiconductor substrate; and a dividing step of subjecting the workpiece with the semiconductor substrate exposed by the wet blasting step to dry etching so as to divide the workpiece along the streets.

In the present invention, the dry etching may be plasma etching in which fluorine-containing gas is used. In addition, in the present invention, the surface protective member may be rubber-based resin.

The processing method according to the described aspect includes the masking step of covering the surfaces of devices with a surface protective member, and the wet blasting step of dispersing abrasive grains in an etching liquid capable of dissolving the metallic pattern and blasting the dispersion against the workpiece together with compressed gas. Therefore, the low-dielectric-constant insulation films and the metallic pattern on the streets can be suitably removed by the abrasive grains and the etching liquid, respectively.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described, referring to the attached drawings. A processing method according to this embodiment is a processing method for processing a workpiece in which low-dielectric-constant films and a metallic pattern are stacked on a semiconductor substrate. The processing method includes a masking step (see FIG. 2A), a wet blasting step (see FIGS. 2B, 3, and 4A), and a dividing step (see FIG. 4B). In the masking step, surfaces of devices formed on the workpiece are covered with a surface protective member, leaving streets exposed. In the wet blasting step, a dispersion of abrasive grains in an etching liquid capable of dissolving the metallic pattern is blasted against the workpiece together with compressed gas, thereby removing the low-dielectric-constant films and the metallic pattern present in regions overlapping with the streets (present on the streets). In the dividing step, the workpiece having undergone the wet blasting step is divided along the streets into a plurality of device chips. The processing method according to this embodiment will be described in detail below.

Figure 1A:
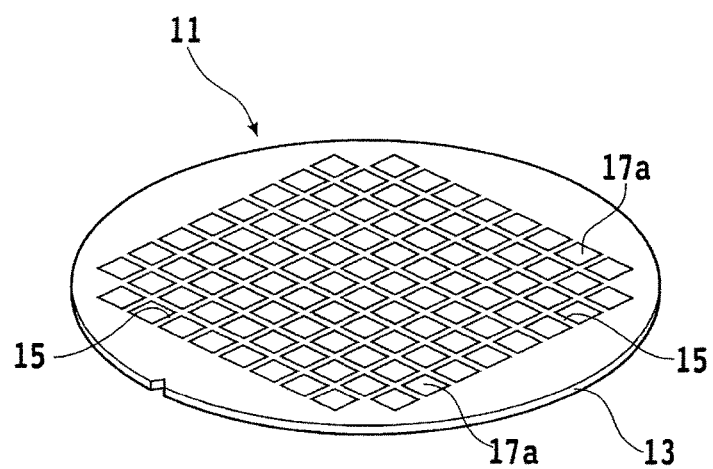
FIG. 1A is a perspective view showing schematically a configuration example of a workpiece.
Figure 1B:
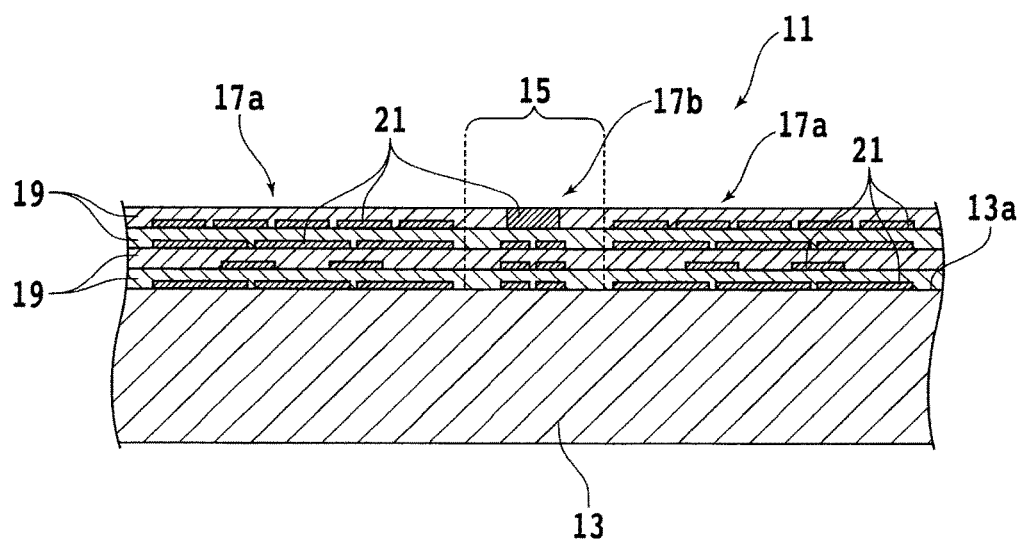
FIG. 1B is a sectional view showing schematically a configuration example of the workpiece.

First, the workpiece to be processed by the processing method in this embodiment will be described. FIG. 1A is a perspective view showing schematically a configuration example of the workpiece, and FIG. 1B is a sectional view showing schematically a configuration example of the workpiece. As shown in FIGS. 1A and 1B, a workpiece 11 in this embodiment includes a disc-shaped semiconductor substrate 13 formed of a semiconductor material such as silicon. An upper surface (front surface) 13a of the semiconductor substrate 13 is divided into a central, device region and a peripheral marginal region surrounding the device region. The device region is further partitioned into a plurality of regions by streets (division lines) 15 arranged in a grid pattern, and devices 17a such as ICs are formed in the regions. On the other hand, a TEG (Test Elements Group) 17b as a test element is disposed in a region overlapping with the street 15, as shown in FIG. 1B. On the upper surface 13a of the semiconductor substrate 13, there are stacked a plurality of low-dielectric-constant insulation films 19 called low-k films, and a plurality of metallic patterns 21 constituting wirings and the like. The low-dielectric-constant insulation films 19 and the metallic patterns 21 constitute part of the aforementioned devices 17a and the TEG 17b.

Figure 2A:
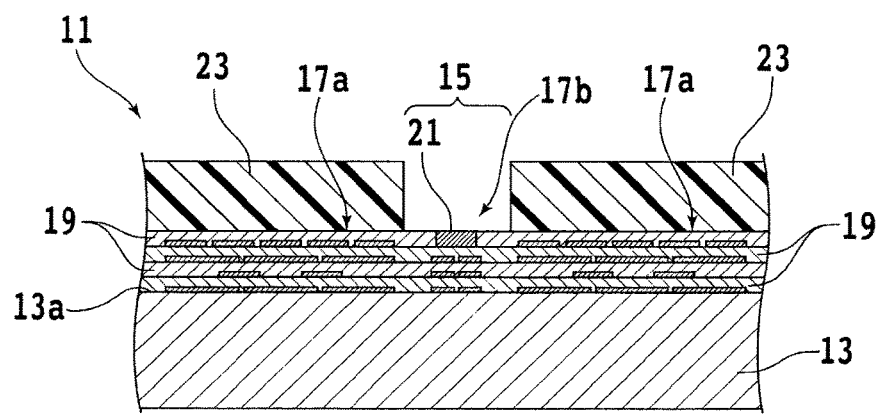
FIG. 2A is a sectional view showing schematically the workpiece after a masking step.

In the processing method in this embodiment, first, a masking step is conducted in which surfaces of the devices 17a are covered with a surface protective member resistant to etching or the like, leaving the streets 15 exposed. FIG. 2A is a sectional view showing schematically the masking step. In the masking step, first, the front surface side of the workpiece 11 (the side of the upper surface 13a of the semiconductor substrate 13) is coated with a negative-type or positive-type photoresist which is resistant to etching or the like (described later). In this embodiment, it is particularly preferable to use a photoresist based on rubber such as cyclized polyisoprene (rubber-based resin). This restrains abrasion of the surface protective member 23 attendant on collision of abrasive grains in the wet blasting step performed later.

Next, using a photomask having a light-transmitting pattern for transmitting light correspondingly to the devices 17a or having a light-blocking pattern for blocking light correspondingly to the devices 17a, the photoresist coating the front surface side of the workpiece 11 is exposed to light and developed, to form the surface protective member 23. Thus, by the so-called photolithography, it is possible to cover the surfaces of the devices 17a with the surface protective member 23 resistant to etching or the like, while leaving the streets 15 exposed. Note that the method for forming the surface protective member 23 is arbitrary. For instance, the surface protective member 23 can also be formed by a method in which a template provided with a plurality of openings corresponding to the devices 17a is used, and a resist material dropped onto the surfaces of the devices 17a through the template is cured.

Figure 2B:
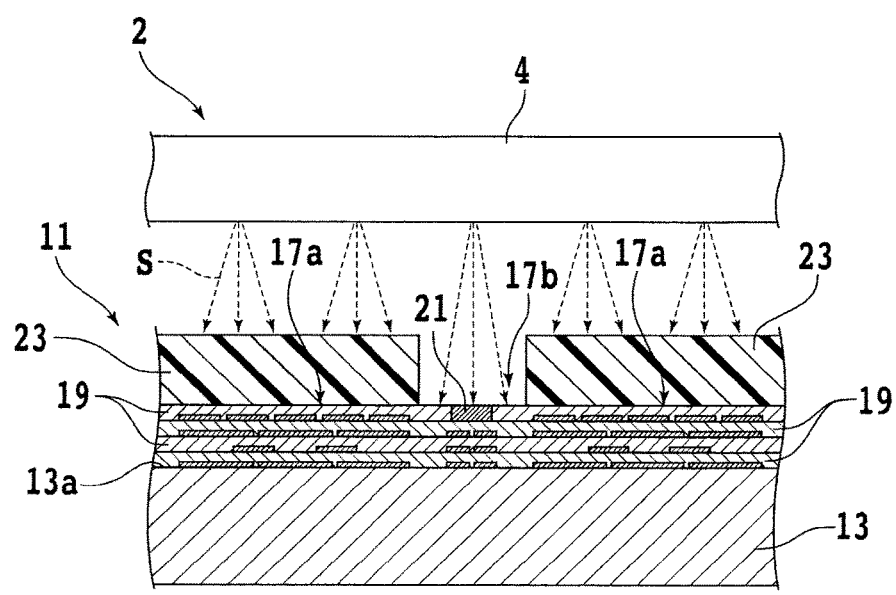
FIG. 2B is a sectional view showing schematically a wet blasting step.
Figure 3:
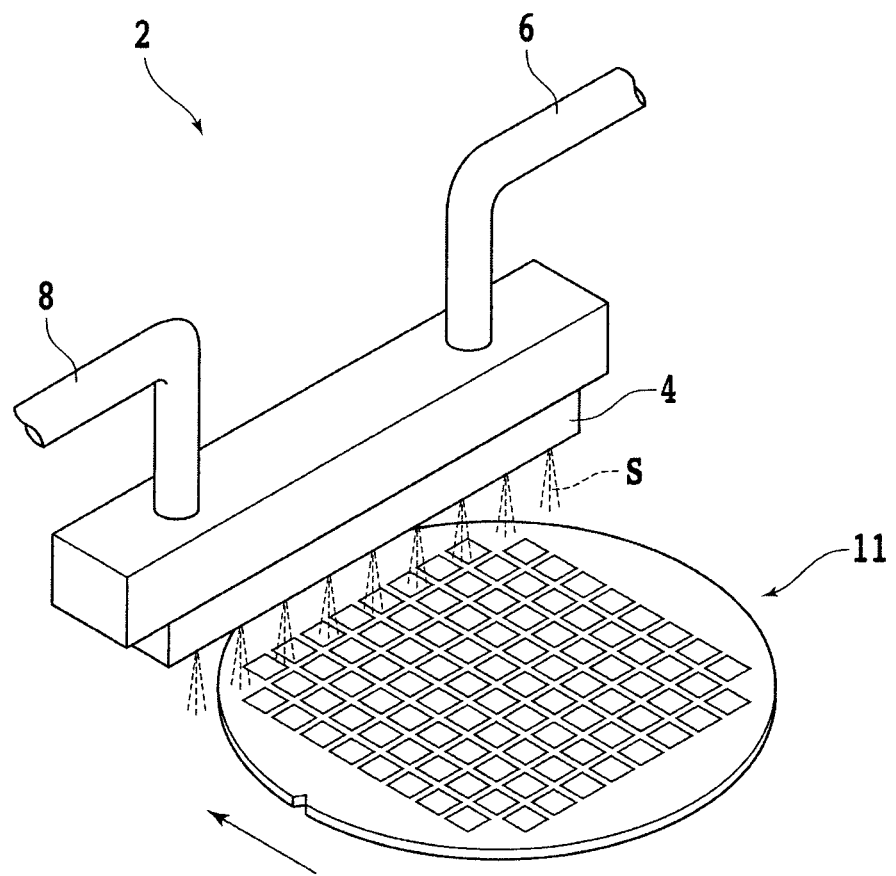
FIG. 3 is a perspective view showing schematically the wet blasting step.

After the masking step, the wet blasting step is conducted in which the low-dielectric-constant insulation films 19 and the metallic patterns 21 in the regions overlapping with the streets 15 are removed. FIG. 2B is a sectional view showing schematically the wet blasting step, and FIG. 3 is a perspective view showing schematically the wet blasting step. The wet blasting step in this embodiment is performed by a wet blasting apparatus (wet blasting means) 2 illustrated in FIGS. 2B and 3. The wet blasting apparatus 2 includes a nozzle 4 for jetting, with compressed gas, a slurry S prepared by dispersing abrasive grains in an etching liquid. To the nozzle 4 are connected a first supply pipe 6 for supplying the slurry S and a second supply pipe 8 for supplying the compressed gas. Under the nozzle 4 is disposed a support table (not shown) for supporting the workpiece 11 thereon. The support table is moved in a horizontal direction by a table moving mechanism (not shown). As shown in FIG. 3, while jetting the slurry S and the compressed gas by the nozzle 4, the support table is moved in a horizontal direction together with the workpiece 11, whereby the slurry S and the compressed gas can be blasted to the whole area on the front surface side of the workpiece 11.

Figure 4A:
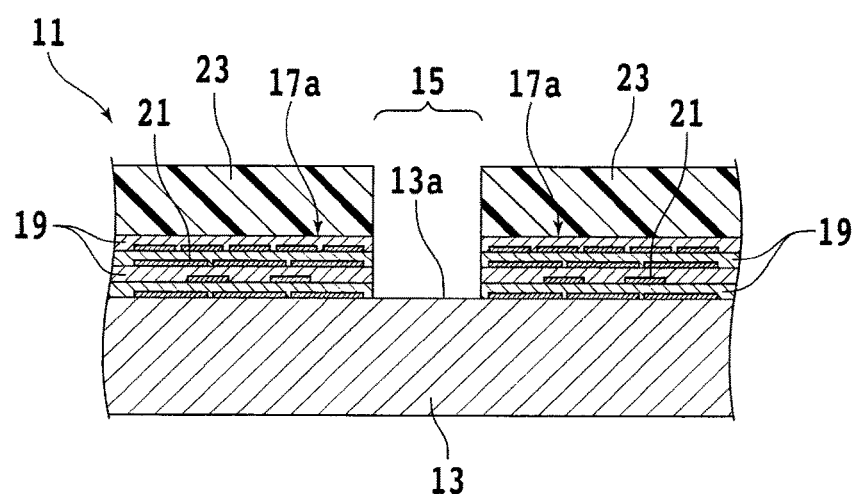
FIG. 4A is a sectional view showing schematically the workpiece after the wet blasting step.

The etching liquid constituting the slurry S is, for example, a mixed liquid which contains hydrofluoric acid or a mixed liquid which contains nitric acid. The etching liquid dissolves the metallic patterns 21. On the other hand, as the abrasive grains dispersed in the etching liquid, there can be used particles of alumina, resin, glass, zirconia or the like. Note that the particles of alumina, resin or the like are mainly formed in the shape of a polyhedron or sphere, whereas the particles of glass, zirconia or the like are mainly formed in spherical shape. The particle diameter and the like of the particles are controlled according to the workpiece 11. The pressure of the compressed gas for jetting the slurry S is, for example, 0.1 to 0.7 MPa. It is to be noted, however, that the pressure of the compressed gas is not limited to within this range, and can be set arbitrarily according to the workpiece 11. FIG. 4A is a sectional view showing schematically the workpiece 11 after the wet blasting step. When the low-dielectric-constant insulation films 19 and the metallic patterns 21 in the regions overlapping with the streets 15 have been removed, leaving the upper surface 13a of the semiconductor substrate 13 exposed there, as shown in FIG. 4A, the wet blasting step is finished.

Figure 4B:
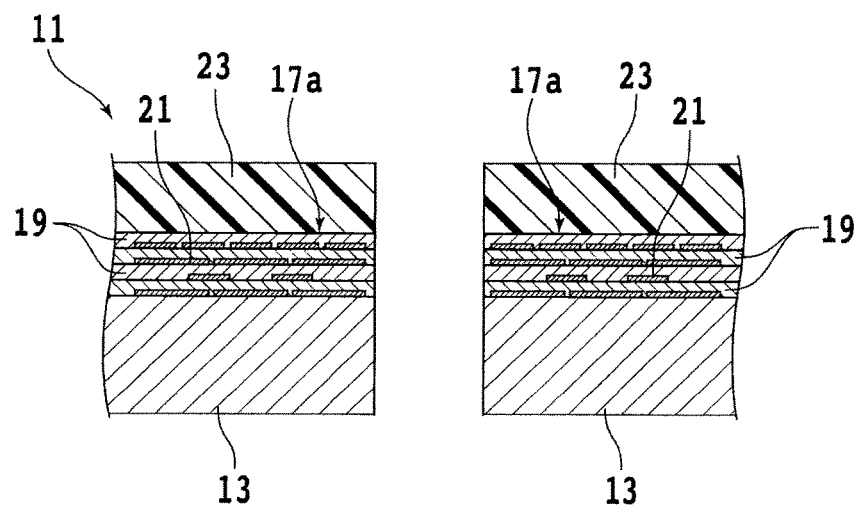
FIG. 4B is a sectional view showing schematically the workpiece after a dividing step.

After the wet blasting step, the dividing step is conducted in which the workpiece 11 is divided along the streets 15. FIG. 4B shows schematically the workpiece 11 after the dividing step. In the dividing step in this embodiment, the workpiece 11 is divided by plasma etching (dry etching). Specifically, first, the workpiece 11 is carried into a processing space of a vacuum chamber. Thereafter, the processing space is hermetically closed, and evacuated. In this state, while a plasma etching gas is supplied into the vacuum chamber at a predetermined flow rate, a predetermined high-frequency electric power is supplied to a pair of electrodes disposed in the vacuum chamber, whereon a plasma containing radicals or ions is generated between the electrodes, and the semiconductor substrate 13 exposed in the area of the streets 15 can be plasma-etched. As the plasma etching gas, there can be used a fluorine-containing gas represented by $SF_6$, $CF_4$, etc. The conditions such as the electric power supplied to the electrodes and the flow rate of the gas are set within such ranges that the semiconductor substrate 13 can be suitably processed. After the workpiece 11 has been divided along the streets 15 into plural device chips, as shown in FIG. 4B, the dividing step is finished. Note that after the dividing step is over, the surface protective member 23 remaining on the font surface side of the workpiece 11 (device chips) is preferably removed by such a method as asking.

As aforementioned, the processing method according to this embodiment includes the masking step of covering the surfaces of the devices 17a with the surface protective member 23, and the wet blasting step of dispersing the abrasive grains in the etching liquid capable of dissolving the metallic patterns 21 and blasting the dispersion against the workpiece 11 together with compressed gas. Accordingly, the low-dielectric-constant insulation films 19 and the metallic patterns 21 on the streets 15 can be suitably removed by the abrasive grains and the etching liquid, respectively.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a workpiece in which a plurality of low-dielectric-constant insulation films and a metallic pattern are stacked on a surface of a semiconductor substrate and in which devices are formed in a plurality of regions formed in a grid pattern, the method comprising:

a masking step of covering surfaces of the devices formed on the workpiece with a surface protective member, leaving spaces between adjacent regions exposed;

a wet blasting step of dispersing abrasive grains in an etching liquid capable of dissolving the metallic pattern, and blasting the dispersion against the workpiece together with compressed gas so as to remove the low-dielectric-constant insulation films and the metallic pattern in the regions, thereby exposing the semiconductor substrate to form streets in the regions; and a dividing step of subjecting the workpiece with the semiconductor substrate exposed by the wet blasting step to dry etching so as to divide the workpiece along the streets, wherein dissolving of the metallic pattern on the streets and removal of the low dielectric constant insulation films are simultaneous in the wet blasting step.

2. The method according to claim 1, wherein the dry etching is plasma etching in which fluorine-containing gas is used.

3. The method according to claim 1, wherein the surface protective member is rubber-based resin.

* * * * *